(12) United States Patent
Chen et al.

(10) Patent No.: US 11,302,770 B2
(45) Date of Patent: Apr. 12, 2022

(54) ARRAY SUBSTRATE, DISPLAY PANEL, AND MANUFACTURING METHOD OF ARRAY SUBSTRATE

(71) Applicant: WUHAN CHINA STAR OPTOELECTRONICS SEMICONDUCTOR DISPLAY TECHNOLOGY CO., LTD., Wuhan (CN)

(72) Inventors: Cheng Chen, Wuhan (CN); Yun Yu, Wuhan (CN)

(73) Assignee: WUHAN CHINA STAR OPTOELECTRONICS SEMICONDUTOR DISPLAY TECHNOLOGY CO., LTD., Wuhan (CN)

( * ) Notice: Subject to any disclaimer, the term of this patent is extended or adjusted under 35 U.S.C. 154(b) by 210 days.

(21) Appl. No.: 16/623,089

(22) PCT Filed: Oct. 12, 2019

(86) PCT No.: PCT/CN2019/110778
§ 371 (c)(1),
(2) Date: Dec. 16, 2019

(87) PCT Pub. No.: WO2021/012408
PCT Pub. Date: Jan. 28, 2021

(65) Prior Publication Data
US 2021/0335990 A1    Oct. 28, 2021

(30) Foreign Application Priority Data

Jul. 24, 2019 (CN) .......................... 201910672699.9

(51) Int. Cl.
*H01L 27/32* (2006.01)
*H01L 51/56* (2006.01)
*H01L 51/00* (2006.01)

(52) U.S. Cl.
CPC ...... *H01L 27/3279* (2013.01); *H01L 27/3258* (2013.01); *H01L 51/56* (2013.01);
(Continued)

(58) Field of Classification Search
CPC ............................................ H01L 27/32–3297
See application file for complete search history.

(56) References Cited

U.S. PATENT DOCUMENTS

2002/0153537 A1\* 10/2002 Segawa ............. H01L 21/28052
257/202
2008/0116515 A1\* 5/2008 Gossner ................ H01L 29/785
257/347
(Continued)

FOREIGN PATENT DOCUMENTS

CN        104752439 A      7/2015
CN        108231854 A      6/2018
(Continued)

*Primary Examiner* — Bryan R Junge
(74) *Attorney, Agent, or Firm* — Osha Bergman Watanabe & Burton LLP

(57) ABSTRACT

The present disclosure provides an array substrate, a display panel, and a manufacturing method of the array substrate. The array substrate includes a substrate layer, an active layer, a first insulating layer, a first metal layer, a second insulating layer, a second metal layer, an interlayer insulating layer, an organic filling layer, and a third metal layer being stacked together. The meshed second metal layer is disposed in the display area, and a double-layer power voltage trace structure in the display area is formed by connecting the first via holes and power voltage signal lines of the third metal layer.

9 Claims, 4 Drawing Sheets

(52) U.S. Cl.
CPC .... *H01L 51/0097* (2013.01); *H01L 2227/323* (2013.01); *H01L 2251/5338* (2013.01)

(56) References Cited

U.S. PATENT DOCUMENTS

| | | | | |
|---|---|---|---|---|
| 2019/0019441 | A1* | 1/2019 | Shin | G09G 3/3233 |
| 2019/0064552 | A1* | 2/2019 | Kim | H01L 27/3246 |
| 2019/0259967 | A1 | 8/2019 | Yang | |
| 2019/0273124 | A1 | 9/2019 | Leng et al. | |
| 2020/0203393 | A1 | 6/2020 | Hu | |
| 2020/0357345 | A1* | 11/2020 | Cho | G09G 3/3233 |

FOREIGN PATENT DOCUMENTS

| | | | |
|---|---|---|---|
| CN | 108389869 | A | 8/2018 |
| CN | 109686758 | A | 4/2019 |
| CN | 109742053 | A | 5/2019 |

\* cited by examiner

ARRAY SUBSTRATE, DISPLAY PANEL, AND MANUFACTURING METHOD OF ARRAY SUBSTRATE

FIELD OF INVENTION

The present disclosure relates to the technical field of displays, and in particular, relates to an array substrate, a display panel, and a manufacturing method of the array substrate.

BACKGROUND OF INVENTION

The organic light emitting display (OLED) has the advantages of light weight, self-luminance, wide viewing angles, low driving voltage, low luminous efficiency, low power consumption, fast response times, and the like. The application range is getting more and more extensive, and especially the flexible OLED display device has the characteristics of being bendable and easy to carry, and has become a main field of research and development in the field of display technology.

At present, the bendable display has attracted much attention, and the tensile breakage or cracks occur after the trace structure is bent multiple times, which seriously affects the service life of the display. High-end terminal equipment requires high brightness uniformity of the display screen, but the existing organic light-emitting diode display device has poor brightness uniformity. Generally, by adding one more source-drain layer to form a double-layer source-drain layer, a double-layer power voltage (ELVDD) trace is deployed to reduce the IR drop, thereby improving screen brightness uniformity.

As a result, it is necessary to provide an array substrate, a display panel, and a manufacturing method of the array substrate to solve the defects existing in the conventional technology.

SUMMARY OF INVENTION

Technical Problem

An object of the present disclosure is to provide an array substrate, a display panel, and a manufacturing method of the array substrate, which can solve the technical problem that brightness uniformity of existing organic light emitting diode display devices is poor, and the tensile breakage or cracks occur after the trace structure is bent a plurality of times.

Solution to Problem

To achieve the above object, the present disclosure provides an array substrate, and the array substrate includes a substrate layer, an active layer, a first insulating layer, a first metal layer, a second insulating layer, a second metal layer, an interlayer insulating layer, an organic filling layer, and a third metal layer being stacked together; wherein a display area, a bending area, and a switching area between the display area and the bending area are defined in the array substrate; the second metal layer located in the display area includes a gate layer configured to connect scan signal lines and a plurality of traces of the second metal layer surrounding the gate layer and configured to connect power voltage signal lines; wherein the traces of the second metal layer are electrically connected to the power voltage signal lines of the third metal layer through a plurality of first via holes to form a double-layer power voltage trace structure in the display area.

Further, the traces of the second metal layer are interlaced with each other in a diamond shape, a curved shape, or a square shape.

Further, the traces of the second metal layer are connected to each other to form a mesh structure.

Further, a resistivity of the first metal layer, the second metal layer, or the third metal layer is greater than 12 $\mu\Omega*cm$.

Further, a material of the first metal layer, the second metal layer, or third metal layer comprises aluminum or an aluminum alloy.

Further, adjacent data signal lines of the third metal layer located in the display area respectively pass through a second via hole and a third via hole to switch to the first metal layer and the second metal layer when extending to the switching area; and the data signal lines of the first metal layer and the second metal layer located in the switching area respectively extend to the bending area, and are electrically connected to each other through fourth via holes to form bending-area data signal traces, and the bending-area data signal traces extend and are disposed below the organic filling layer.

Further, the adjacent data signal lines of the third metal layer located in the display area are in a multi-segment structure when passing through the switching area; and when the data signal lines of the third metal layer located in the switching area extend to the bending area, a portion of the data signal lines of the third metal layer extend through the bending area above the organic filling layer, and another portion of the data signal lines of the third metal layer pass through the third via holes to switch to the second metal layer and pass through the bending area to form a double-layer data signal trace structure in the bending area.

Further, the substrate layer includes a flexible substrate, a barrier layer located on the flexible substrate, and a buffer layer disposed on the barrier layer, and the buffer layer is connected to a side of the active layer facing away from the first insulating layer.

The present disclosure provides a manufacturing method of an array substrate, wherein a display area, a bending area, and a switching area between the display area and the bending area are defined in the array substrate, and the manufacturing method comprises steps of:

disposing a substrate layer; disposing an active layer, wherein the active layer is formed on the substrate layer;

disposed a first insulating layer, wherein the first insulating layer is formed on the active layer;

disposing a first metal layer, wherein a material of the first metal layer includes aluminum or an aluminum alloy, and the first metal layer is formed on the first insulating layer and patterned;

disposing a second insulating layer, wherein the second insulating layer is formed on the first metal layer;

disposing a second metal layer, wherein a material of the second metal layer includes aluminum or an aluminum alloy, the second metal layer is formed on the second insulating layer and patterned to form traces of the second metal layer, and the traces of the second metal layer are connected to each other to form a mesh structure;

disposing an interlayer insulating layer, wherein the interlayer insulating layer is formed on the second metal layer and etched to form first via holes; and disposing a third metal layer, wherein a material of the third metal layer includes aluminum or an aluminum alloy, the third metal layer is formed on the interlayer insulating layer and patterned, and power voltage signal lines of the third metal layer are electrically connected to the second metal layer trances through the first via holes.

The present disclosure provides a display panel, wherein the display panel comprises an array substrate.

Advantageous Effects of Invention

The present disclosure has the beneficial effects: the present disclosure provides an array substrate, a display panel, and a manufacturing method of the array substrate. The double-layer power voltage trace of the display area can be connected through the second metal layer and the third metal layer without adding a metal trace, thereby reducing the IR drop, improving the screen brightness uniformity, and cutting costs. The data trace of the bending area of the present disclosure is arranged under the organic filling layer of the bending area to form a double-layer data signal trace structure in the bending area, which reduces the bending stress and improves the bending performance.

Figure 1:
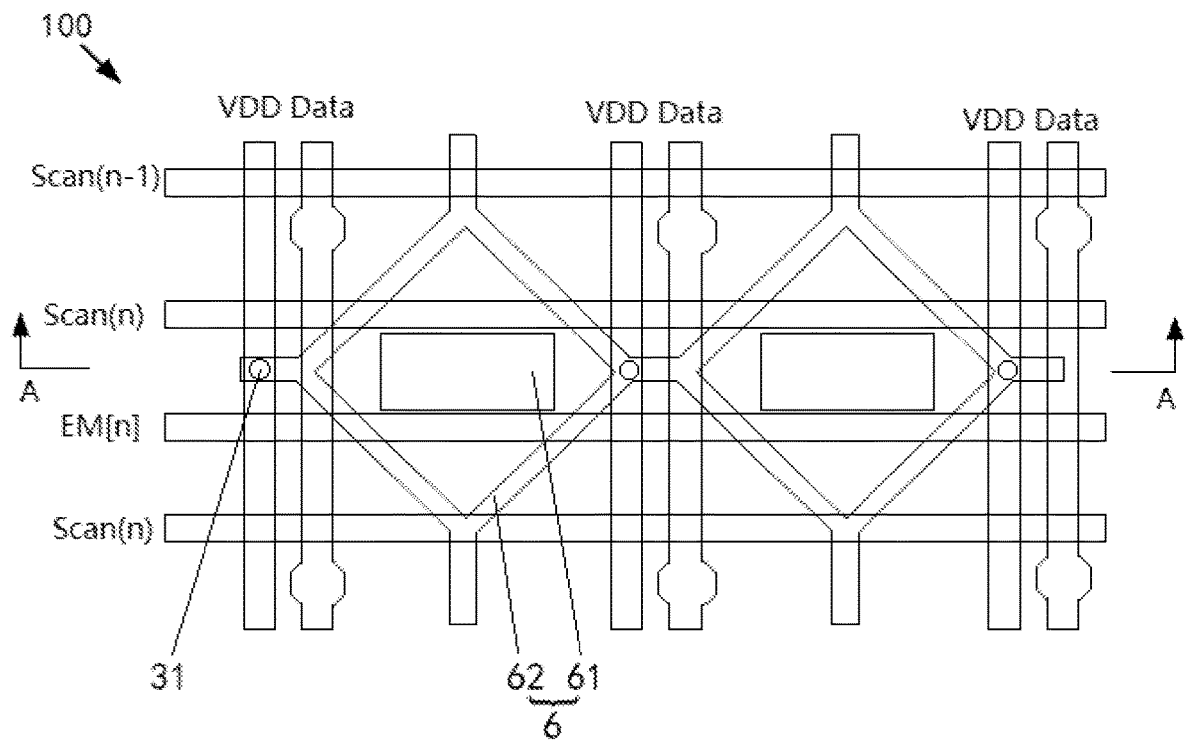
FIG. 1 is a schematic view of an array substrate disposed in a display area according to a present disclosure.

The components in the figures are identified as follows: 1 substrate layer, 2 active layer, 3 first insulating layer, 4 first metal layer, 5 second insulating layer, 6 second metal layer, 7 interlayer insulating layer, 8 organic filling layer, 9 third metal layer, 10 flat layer, 11 anode layer, 12 pixel definition layer, 13 support layer, 31 first via holes, 32 second via holes, 33 third via holes, 34 fourth via holes, 61 gate layer, 62 traces of the second metal layer, 63 bending-area data signal traces, 100 array substrate, 101 display area, 102 switching area, 103 bending area, 110 flexible substrate, 120 barrier layer, 130 buffer layer, 200 thin film transistor unit.

DETAILED DESCRIPTION OF PREFERRED EMBODIMENTS

In the description of the present disclosure, it is to be understood that terms such as "central", "upper", "lower", "front", "rear", "left", "right", "vertical", "horizontal", "top", "bottom", "inner", "outer", etc. should be construed to refer to the orientation or position as shown in the drawings under discussion. Therefore, the directional terminology used is for the purpose of illustration and understanding of the present disclosure. In the figures, structurally similar elements are denoted by the same reference numerals.

In the description of the present disclosure, terms such as "first" and "second" are used herein for purposes of description and are not intended to indicate or imply relative importance or to imply the number of indicated technical features. Thus, the feature defined with "first" and "second" may explicitly or implicitly include one or more of the features. Furthermore, the terms "including" and "having" and any variants thereof are intended to cover non-exclusive inclusions.

Figure 2:
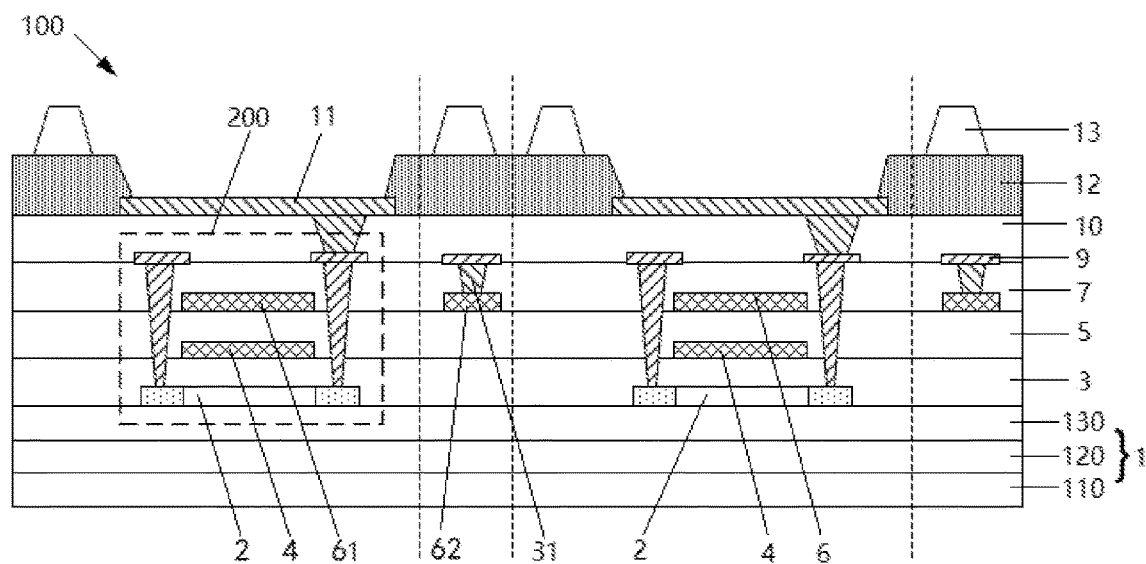
FIG. 2 is a cross-sectional view taken along line A-A of FIG. 1.
Figure 3:
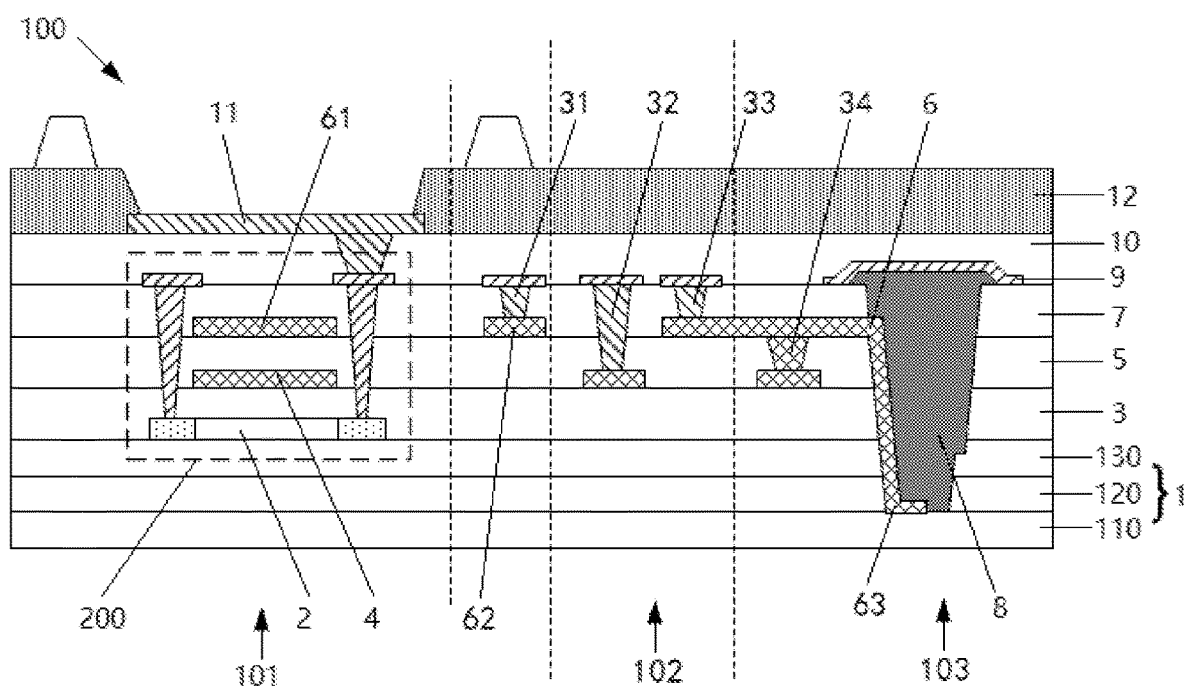
FIG. 3 is a schematic view of an array substrate according to the present disclosure.
Figure 4:
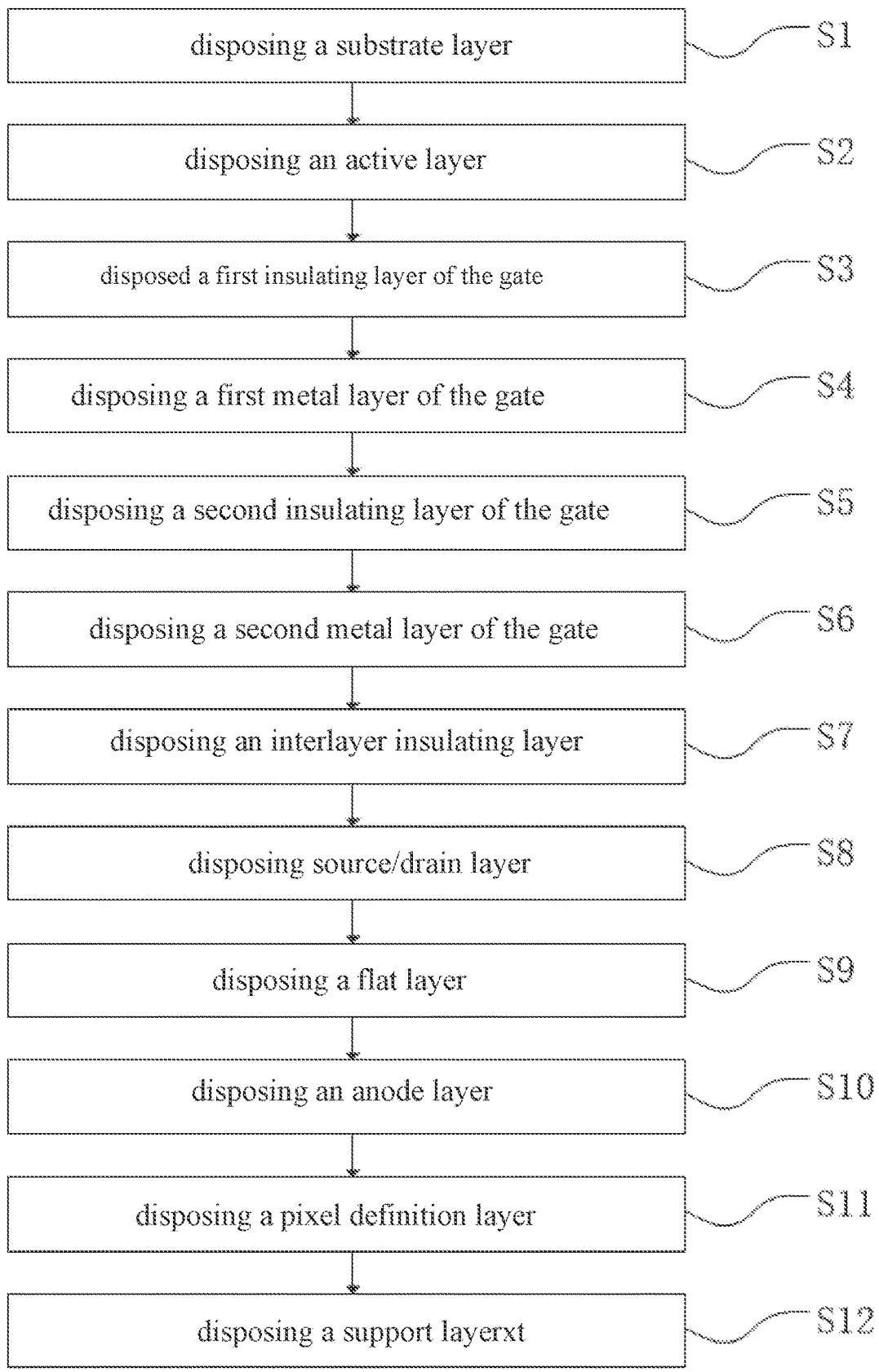
FIG. 4 is a flow chat of a manufacturing method of the array substrate according to the present disclosure.

Referring to FIGS. 1-3, the present disclosure provides an array substrate 100 comprising a substrate layer 1, an active layer 2, a first insulating layer 3, a first metal layer 4, a second insulating layer 5, a second metal layer 6, an interlayer insulating layer 7, an organic filling layer 8, and a third metal layer 9, a flat layer 10, an anode layer 11, a pixel definition layer 12, and a support layer 13 being stacked together, wherein the substrate layer 1 includes a flexible substrate 110, a barrier layer 120, and a buffer layer 130 being sequentially stacked.

Specifically, the barrier layer 120 is located on the flexible substrate 110; the buffer layer 130 is located on the barrier layer 120; the active layer 2 is located on the buffer layer 130; the first insulating layer 3 is located on the active layer 2; the first metal layer 4 is located on the first insulating layer 3; the second insulating layer 5 is located on the first metal layer 4; the second metal layer 6 is located on the second insulating layer 5; the interlayer insulating layer 7 is located on the second metal layer 6; the third metal layer 9 is located on the interlayer insulating layer 7; the flat layer 10 is located on the third metal layer 9; the anode layer 11 is located on the flat layer 10; the pixel definition layer 12 is located on the anode layer 11; the support layer 13 is located on the pixel definition layer 12. The organic filling layer 8 is only disposed in the bending area 103, and the organic filling layer 8 passes through the barrier layer 120, the buffer layer 130, the first insulating layer 3, the second insulating layer 5, and the interlayer insulating layer 7.

Referring to FIGS. 1 and 2, the array substrate 100 is provided with a display area 101. Referring to FIG. 3, the array substrate 100 further includes a switching area 102 and a bending area 103, wherein the switching area 102 is located between the display area 101 and the bending area 103. The second metal layer 6 located in the display area 101 includes a gate layer 61 configured to connect scan signal lines, and a plurality of traces of the second metal layer 62 surrounding the gate layer 61 and configured to connect power voltage signal lines. The traces of the second metal layer 62 are electrically connected to power voltage signal lines of the third metal layer 9 through a plurality of first via holes 31 to form a double-layer power voltage trace structure in the display area. In the embodiment, the third metal layer 9 is a source and drain layer.

The traces of the second metal layer 62 of double-layer power voltage trace structure in the display area are connected in parallel with the third metal layer 9 to reduce the resistance value of the circuit. When a certain layer of circuit is turned off, it can be turned on through another layer of circuit, which improves reliability.

Referring to FIG. 1, in the embodiment, the traces of the second metal layer 62 are interlaced with each other in a diamond shape, a curved shape, or a square shape. The traces of the second metal layer 62 are connected to each other to form a mesh structure (or chain structure).

In the embodiment, a resistivity of the first metal layer, the second metal layer, or the third metal layer is greater than 12 $\mu\Omega^*cm$. The conductivity and the resistivity can be converted, and the conversion is not redundantly described herein.

In the embodiment, a material of the first metal layer 4, the second metal layer 6, or third metal layer 9 comprises aluminum or an aluminum alloy. The present disclosure uses aluminum or the aluminum alloy to dispose the metal traces (refer to the first metal layer 4, the second metal layer 6, or the third metal layer 9). The electrical conductivity and bending characteristics of the metal traces can be improved, and the risk of dynamic bending breaks can be reduced.

Refer to FIGS. 2 and 3. FIG. 2 is a cross-sectional view taken along line A-A of FIG. 1. and FIG. 3 is a schematic view of a whole structure of an array substrate 100 according to the present disclosure are illustrated. Adjacent data signal lines of the third metal layer 9 located in the display area 101 respectively pass through a second via hole 32 and a third via hole 33 to switch to the first metal layer 4 and the second metal layer 6 when extending to the switching area 102. The data signal lines of the first metal layer 4 and the second metal layer 6 located in the switching area 102 respectively extend to the bending area 103, and are electrically connected to each other through fourth via holes 34 to form bending-area data signal traces 63, and the bending-area data signal traces 63 extend and are disposed below the organic filling layer 8. In other words, the data signal lines of the second metal layer 6 located in the switching area 102 directly extends to the bending area 103, the data signal lines of the metal layer 4 located in the switching area 103 pass through the fourth via holes 34 to switch to the second metal layer 6 when extending to the bending area 103, and the bending-area data signal traces 63 extend and are disposed below the organic filling layer 8.

The data signal lines in the display area 101 extend to the switching area 102 to connect the first metal layer 4 and the second metal layer 6. The two-layer trances can save space, and the switching area 102 can achieve a narrow bezel design.

The adjacent data signal lines of the third metal layer 9 located in the display area 101 are in a multi-segment structure when passing through the switching area, wherein the multi-segment structure can be paralleled to achieve the effect of reducing the resistance. When the data signal lines of the third metal layer 9 located in the switching area 102 extend to the bending area 102, a portion of the data signal lines of the third metal layer 9 extend through the bending area 102 above the organic filling layer 8, and another portion of the data signal lines of the third metal layer 9 pass through the third via holes 32 to switch to the second metal layer 6 and pass through the bending area 103 to form a double-layer data signal trace structure in the bending area.

In the embodiment, the initialization voltage signal lines (VI signal lines) may be designed in the third metal layer 9 or the anode layer 11 of the display area.

Referring to FIG. 2, in the display area 101, the active layer 2, the first insulating layer 3, the first metal layer 4, the second insulating 5, the second metal layer 6, and the interlayer insulating 7 are sequentially stacked. A thin film transistor unit is formed of the third metal layer 9. Referring to FIG. 1, the gate of the thin film transistor unit 200 (refer to the first metal layer 4 and the gate layer 61 of the second metal layer 6) is connected to scan signal (Scan) or light emitting signal (EM), and the third metal layer 9 is connected to a DC high voltage (VDD) or an input data voltage (Data), which are all conventional technology and is not redundantly described in detail herein.

In the embodiment, the double-layer power voltage trace structure in the display area is disposed around the thin film transistor unit 200. Specifically, in the display area 101, the traces 62 of the second metal layer 6 are disposed around the thin film transistor unit 200. In other words, the traces 62 of the second metal layer located in the display area are disposed around the gate layer 61. In the embodiment, the traces of the second metal layer 62 are preferably interlaced with each other in a diamond shape, a curved shape, or a square shape. Referring to FIG. 1, the gate of the thin film transistor unit 200 includes the first metal layer 4 and the gate layer 61 of the second metal layer 6, wherein the first metal layer 4 serves as a capacitor lower electrode. The gate layer 61 of the second metal layer 6 serves as a capacitor upper electrode. In the display area, the traces 62 of the second metal layer are electrically connected to the third metal layer 9 through the first via holes 31 to form the double-layer trace structure in the display area. The power voltage is connected in parallel on the double-layer trace structure in the display area, and the resistance thereof is decreased compared with the prior art. The double-layer trace structure in the display area can reduce the resistance of the VDD signal traces. Therefore, the voltage loss value can be reduced, thereby improving the brightness uniformity.

If the neutral surface is defined as a position that is not subjected to compressive stress and is not subjected to tensile stress when bent, the bending stress at the position is 0, and the closer the thread is to the neutral surface, the less likely it is to break. The neutral surface of the general product is located on the lower surface of the array substrate 100 (flexible substrate 110). Therefore, the closer the signal trace is to the flexible substrate 110, the better the bending characteristics. However, the signal traces of the conventional design are all near the upper surface of the array substrate 100, which are far from the neutral surface and are therefore easily broken. Compared with the prior art, the signal traces of the double-layer trace structure proposed by the present disclosure are moved down as a whole, and are closer to the neutral plane. By setting the double-layer trace structure, the tensile stress of the trace structure can be reduced, thereby improving the bending characteristics, reducing the risk of trace breakage, and increasing the service life.

The function of disposing the organic filling layer 8 in the bending area 103 is to achieve a reduction in the bending stress, and the purpose of the bending is to realize a narrow bezel design. In the present embodiment, the organic material of the organic filling layer 8 is preferably an oxidative dehydrogenation organic substance. In other embodiments, the organic material of the organic filling layer 8 may be a series of flexible organic materials, such as polyimide resin or siloxane. The double-layer data signal trace structure of the bending area is disposed above and below the organic filling layer 8, and the organic filling layer 8 has flexibility to act to buffer the stress.

In a specific implementation, referring to FIG. 1 to FIG. 4, an embodiment of the present disclosure provides a manufacturing method of an array substrate 100, which specifically includes the following steps:

S1, disposing a substrate layer 1;

S2, disposing an active layer 2, wherein the active layer 2 is formed on the substrate layer 1;

S3, disposed a first insulating layer 3, wherein the first insulating layer 3 is formed on the active layer 2;

S4, disposing a first metal layer 4, wherein a material of the first metal layer 4 includes aluminum or an aluminum alloy, and the first metal layer 4 is formed on the first insulating layer 3 and patterned;

S5, disposing a second insulating layer 5, wherein the second insulating layer 5 is formed on the first metal layer 4, a plurality of fourth via holes 34 are formed on the second insulating layer 5 of the bending area 103, and the bottom of the fourth via holes 34 is the first metal layer 4;

S6, disposing a second metal layer 6, wherein a material of the second metal layer 6 includes aluminum or an aluminum alloy, the second metal layer 6 is formed on the second insulating layer 5 and patterned to form a gate layer 61 and traces of the second metal layer 62, the traces of the second metal layer 62 are disposed around the gate layer 61 (upper electrode), the traces of the second metal layer 62 are connected to each other to form a mesh structure, and the fourth via holes 34 are filled in the second metal layer 6 to electrically connect the first metal layer 4 in the bending area 103;

S7, disposing an interlayer insulating layer 7, wherein the interlayer insulating layer 7 is formed on the second metal layer 6 and the interlayer insulating layer 7 located in the display area 101 is etched to form first via holes 31, and second via holes 32 and third via holes 33 are formed on the interlayer insulating layer 7 located in the bending area 103, wherein the bottom of the first via holes 31 and the third via holes are the second metal layer 6, and the bottom of second via holes 32 is the first metal layer 4;

S8, disposing a third metal layer 9, wherein a material of the third metal layer 9 includes aluminum or an aluminum alloy, the third metal layer 9 is formed on the interlayer insulating layer 7 and patterned, the first via holes 31 and the third via holes 33 are filled in the third metal layer 9, the power voltage signal lines of the third metal layer 9 pass through the first via holes 31 and the third via holes to electrically connect the traces of the second metal layer 62 to form a double-layer power voltage trace structure, and the second via holes are filled in the third metal layer 9 to electrically connect the first metal layer 4;

S9, disposing a flat layer 10, wherein the flat layer 10 is formed on the third metal layer 9;

S10, disposing an anode layer 11, wherein the anode layer 11 is formed on the flat layer 10 and patterned, and the anode layer 11 is electrically connected to the third metal layer 9;

S11, disposing a pixel definition layer 12, wherein the pixel definition layer 12 is formed on the anode layer 11 and patterned, and the anode layer 11 is exposed to form a pixel definition groove; and S12, disposing a support layer 13, wherein the support layer 13 is formed on the pixel definition layer 12 and patterned.

In the embodiment, the material of the first metal layer 4, the second metal layer 6, or third metal layer 9 comprises aluminum or an aluminum alloy, and the resistivity of the first metal layer 4, the second metal layer 6, or the third metal layer 9 is greater than 12 μΩ*cm.

The material of the first metal layer 4, the second metal layer 6, or third metal layer 9 comprises aluminum or an aluminum alloy. The metal traces made of aluminum or aluminum alloy enhance the conductivity and bending characteristics of the metal traces and reduce the risk of dynamic bending breakage.

Figure 5:
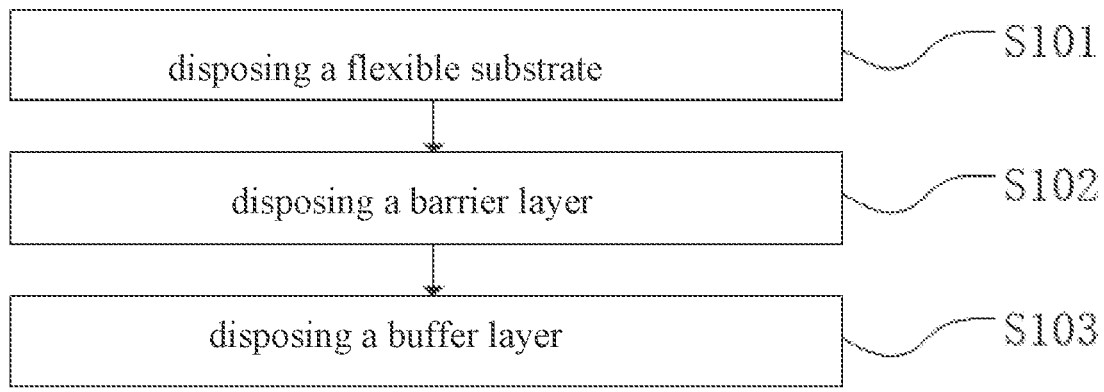
FIG. 5 is a flow chat of the steps of disposing a substrate layer in FIG. 4.
Figure 6:
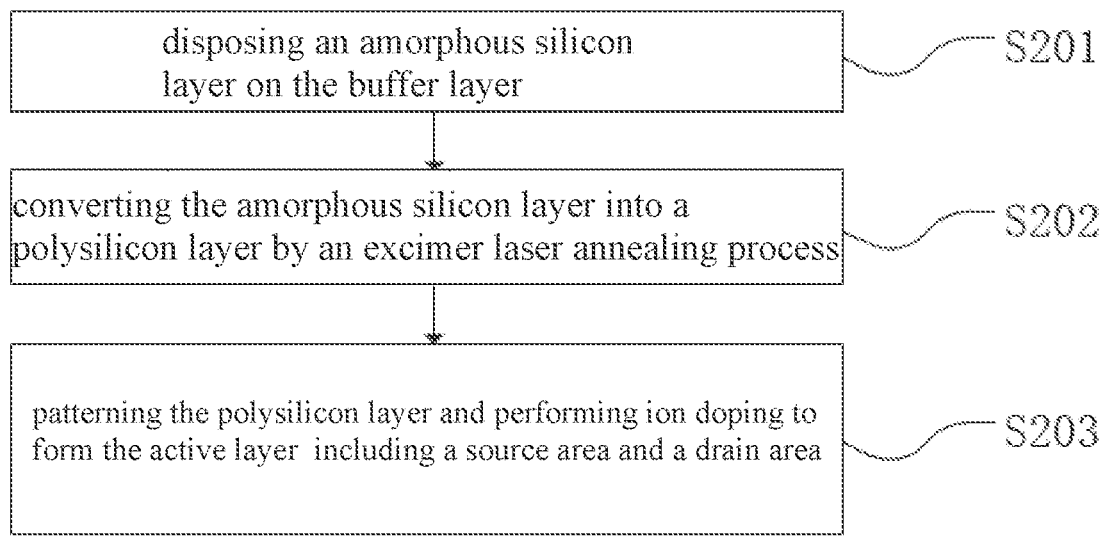
FIG. 6 is a flow chat of the steps of disposing an active layer in FIG. 4.

Referring to FIG. 5, in the embodiment, the step S1 of disposing the substrate layer 1 specifically includes the following steps:

S101, disposing a flexible substrate 110;

S102, disposing a barrier layer 120, wherein the barrier layer 120 is formed on the flexible substrate 110;

S103, disposing a buffer layer 130, wherein the buffer layer 130 is formed on the barrier layer 120;

Referring to FIG. 6, in the embodiment, the step S2 of disposing the active layer 2 specifically includes the following steps:

S201, disposing an amorphous silicon layer on the buffer layer 130;

S202, converting the amorphous silicon layer into a polysilicon layer by an excimer laser annealing process;

S203, patterning the polysilicon layer and performing ion doping to form the active layer 2 including a source area 21 and a drain area 22.

The present disclosure also provides a display panel including the array substrate 100 described above. The display panel in this embodiment may be any product or component having a display function, such as wearable devices, mobile phones, tablet computers, televisions, display devices, notebook computers, e-books, electronic newspaper, digital photo frames, navigators, and the like. The wearable devices include smart bracelets, smart watches, and virtual reality (VR) devices.

The above description is only a preferred embodiment of the present disclosure, and it should be noted that those skilled in the art can also make improvements and retouches without departing from the principles of the present invention. These improvements and retouches should also be considered as protection of the present disclosure.

What is claimed is:

1. An array substrate, comprising:
   a substrate layer, an active layer, a first insulating layer, a first metal layer, a second insulating layer, a second metal layer, an interlayer insulating layer, an organic filling layer, and a third metal layer being stacked together;
   wherein a display area, a bending area, and a switching area between the display area and the bending area are defined in the array substrate; the second metal layer located in the display area includes a gate layer configured to connect scan signal lines and a plurality of traces of the second metal layer surrounding the gate layer and configured to connect power voltage signal lines;
   wherein the traces of the second metal layer are electrically connected to the power voltage signal lines of the third metal layer through a plurality of first via holes to form a double-layer power voltage trace structure in the display area.

2. The array substrate according to claim 1, wherein the traces of the second metal layer are interlaced with each other in a diamond shape, a curved shape, or a square shape.

3. The array substrate according to claim 1, wherein the traces of the second metal layer are connected to each other to form a mesh structure.

4. The array substrate according to claim 1, wherein a resistivity of the first metal layer, the second metal layer, or the third metal layer is greater than 12 μΩ*cm.

5. The array substrate according to claim 1, wherein a material of the first metal layer, the second metal layer, or third metal layer comprises aluminum or an aluminum alloy.

6. The array substrate according to claim 1, wherein adjacent data signal lines of the third metal layer located in the display area respectively pass through a second via hole and a third via hole to switch to the first metal layer and the second metal layer when extending to the switching area; and
   the data signal lines of the first metal layer and the second metal layer located in the switching area respectively extend to the bending area, and are electrically connected to each other through fourth via holes to form bending-area data signal traces, and the bending-area data signal traces extend and are disposed below the organic filling layer.

7. The array substrate according to claim 6, wherein the adjacent data signal lines of the third metal layer located in the display area are in a multi-segment structure when passing through the switching area; and when the data signal lines of the third metal layer located in the switching area extend to the bending area, a portion of the data signal lines of the third metal layer extend through the bending area above the organic filling layer, and another portion of the data signal lines of the third metal layer pass through the third via holes to switch to the second metal layer and pass through the bending area to form a double-layer data signal trace structure in the bending area.

8. The array substrate according to claim 1, wherein the substrate layer includes a flexible substrate, a barrier layer located on the flexible substrate, and a buffer layer disposed on the barrier layer, and the buffer layer is connected to a side of the active layer facing away from the first insulating layer.

9. A display panel, comprising an array substrate according to claim 1.

* * * * *